United States Patent

Katthän

[11] 4,313,222
[45] Jan. 26, 1982

[54] H-F PORTION OF TV RECEIVER

[75] Inventor: Walter Katthän, Hildesheim, Fed. Rep. of Germany

[73] Assignee: Blaupunkt Werke GmbH, Hildesheim, Fed. Rep. of Germany

[21] Appl. No.: 149,028

[22] Filed: May 12, 1980

[30] Foreign Application Priority Data

May 25, 1979 [DE] Fed. Rep. of Germany ....... 2921219

[51] Int. Cl.³ .............................................. H04B 1/26
[52] U.S. Cl. .................................. 455/319; 455/338; 333/24 R
[58] Field of Search ............... 455/318, 319, 320, 338; 307/74, 75, 148, 151; 331/182, 183; 333/24 R, 25, 32, 35

[56] References Cited

U.S. PATENT DOCUMENTS

| | | | |
|---|---|---|---|
| 2,654,836 | 10/1953 | Beck | 455/320 |
| 3,226,665 | 12/1965 | Luna | 333/24 |
| 3,299,384 | 1/1967 | Lee | 333/24 |
| 4,207,544 | 6/1980 | Klostermark | 333/24 R |

Primary Examiner—Jin F. Ng
Assistant Examiner—Tommy P. Chin
Attorney, Agent, or Firm—Frishauf, Holtz, Goodman & Woodward

[57] ABSTRACT

The output electrode of a field effect transistor of a high-frequency input stage is connected to a capacitively coupled input (gate) electrode of the field effect transistor of a mixer stage through one of a pair of bifilarly wound coils provided on a ferrite core, while the second of these coils connects the same input of the mixer stage to the output of a local oscillator in such a way that two signal paths leading towards the mixer stage, respectively for the high-frequency signal and the oscillator signal, go through coupled coils in opposite winding directions. The result is that the path for signals in either direction between the local oscillator and the input stage are of much higher impedance than the paths for signals proceeding to the mixer stage respectively from the input stage and from the local oscillator.

3 Claims, 2 Drawing Figures

H-F PORTION OF TV RECEIVER

The present invention relates to a so-called "front-end" portion of a radio or a television receiver, containing an input stage, sometimes known as a "preselector" or a "preamplifier" stage or as a radio-frequency amplifier stage, an oscillator and a mixer stage, and more particularly concerns the coupling between the outputs of the preselector and oscillator with the input of the mixer.

Known ways of coupling preselector and oscillator outputs to a mixer stage are capacitive coupling utilizing coupling capacitors respectively connecting the preselector output and oscillator output to the mixer input and transformer coupling in which the output currents of the preselector stage and of the oscillator pass out from an active or ungrounded terminal of that stage or of the oscillator, then pass through the turns of a winding of the transformer and return to ground or reference potential for return to the stage from which these currents were generated, while other turns of a transformer winding operate as the transformer secondary to generate current between ground or reference potential and the active or ungrounded input terminal of the mixer stage.

Preselector-oscillator-mixer couplings of the known types produce troublesome backward reactions from the oscillator causing undesired mixing in the input stage and outward radiation therefrom.

SUMMARY OF THE INVENTION

It is an object of the present invention to provide a preselector-oscillator-mixer circuit having a coupling arrangement that reduces the backward reaction influence of the oscillator on the input or preselector stage, in addition to providing a broad coupling bandwidth.

Briefly, coils wound around together in bifilar fashion are utilized for the coupling, the output of the input stage being connected through a first one of these coils to the input of the mixer stage and the output of the oscillator being connected through the other of these coils to the input of the mixer, while the respective signal paths from the preselector and oscillator output to the mixer input pass through the turns of the coils in opposed directions of winding. For simplification, the foregoing statement assumes that, in accordance with the usual receiver practice, "single ended" stages are used, so that the fact that chassis or ground connections provide a return path for currents is not regarded as providing "input" or "output" terminals. This is to say that the input and output connections referred to are all ungrounded circuits points.

A preselector-oscillator-mixer combination according to the invention has the advantage of reducing the backward reaction of the oscillator on the input stage. This reduction of undesired effect is further improved if the coils wound in bifilar fashion have the same number of turns and are wound on a ferrite core.

The resulting reduction of backward reaction prevents undesired mixing effects in the input stage and, also, reduces unwanted and externally interfering output signals of the local oscillator from being radiated outward through the input of the input stage.

On account of the high degree of decoupling of the mixer-oscillator from the input stage by a circuit of the present invention, it is particularly advantageous to utilize the present invention for those high frequency receivers that utilize a field effect transistor in the mixer stage that needs to be driven at relatively high output voltages provided by the local oscillator.

It has also been found to be advantageous that with circuits of the present invention the couplings of the mixer stage to the input stage and to the local oscillator is highly "broad band," so that a substantially constant level of drive of the mixer stage by the local oscillator is possible over very large frequency region.

The preselector-oscillator-mixer stage combination according to the invention is particularly useful in the so-called "tuner" section of a television receiver, regardless of whether the receiver operates from an antenna input or has its input provided by a cable system of signal distribution.

BRIEF DESCRIPTION OF THE DRAWINGS

The invention is described in further detail by way of illustrative example with reference to the annexed drawings in which.

DETAILED DESCRIPTION OF THE INVENTION

Figure 1:
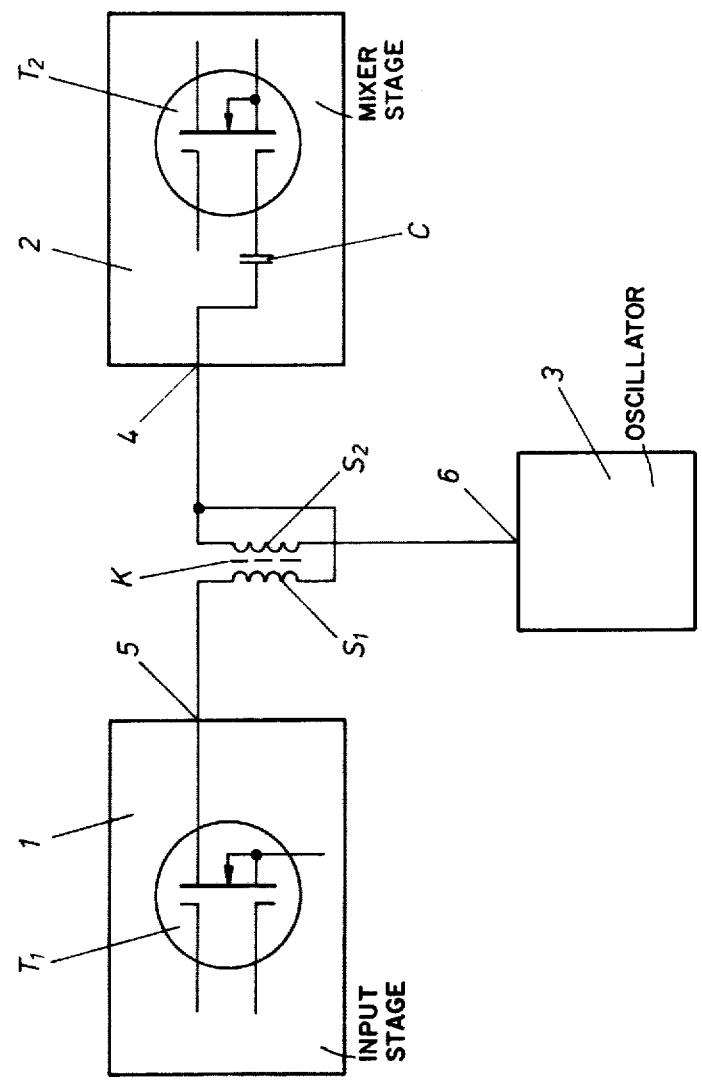
FIG. 1 is a block diagram of a high-frequency "front end" combination of stages for a television receiver.

The high-frequency receiving stage assembly of FIG. 1 consists of an input stage 1, which may be referred to as the "preselector stage," the mixer stage 2, and the oscillator stage 3 which is commonly referred to as a "local oscilator." Input stage 1 is equipped in its output portion with a field effect transistor $T_1$. The mixer stage 2 is equipped with a field effect transistor $T_2$.

The input 4 of the mixer stage 2 is on the one hand connected through the coil $S_1$ with the output 5 of the input stage 1 and, on the other hand, through the coil $S_2$ with the output 6 of the local oscillator. The coils $S_1$ and $S_2$ are wound bifilarly together which is to say that the turns of one are between the turns of the other, and they are so connected with the input stage 1, the mixer stage 2, and the local oscillator 3, that the respective signal paths from the output 5 of the input stage 1 and from the output 6 of the local oscillator 3 to the input 4 of the mixer stage 2 turn in opposite winding senses in the coils $S_1$ and $S_2$.

As a result of this configuration and these connections, the magnetic field produced in the coils $S_1$ and $S_2$ by the output signals reaching the input 4 of the mixer 2 from the input stage 1 and the local oscillator 3 are so set up that the coils $S_1$ and $S_2$ form signal paths of very high admittance for these signals. The output signals of the input stage 1 and of the local oscillator 3 are therefore not attenuated appreciably on their way to the mixer stage 2.

In contrast to the foregoing, the output signals from the local oscillator 3 that can get into the input stage 1 through the coils $S_2$ and $S_1$ produce a magnetic field in those coils that is not compensated, so that the coils $S_2$ and $S_1$ provide a signal path of very high impedance for any portion of the output signal of the local oscillator 3 that can reach the output 5 of the input stage 1.

The coils $S_1$ and $S_2$ likewise provide a signal path of very high impedance for any portion of the output signals of the input stage 1 that can reach the output 6 of the local oscillator 3.

The configuration and the external connections of the coils $S_1$ and $S_2$ thus provide a most through decoupling of the input stage 1 and of the local oscillator 3. At the higher frequencies, the capacitive properties of the coil arrangement are particularly responsible for the described effects.

These obtained effects provided by the constitution of high-frequency receiving stages according to the invention can be further improved substantially by winding the coils $S_1$ and $S_2$ bifilary on a ferrite core.

Because of the high signal voltages, particularly the high oscillator voltages, that are necessary for driving mixer stages equipped with field effect transistors, it is particularly advantageous to design and construct receiver high-frequency stages of such mixers according to the present invention.

In the circuit of FIG. 1, the field effect transistor $T_2$ of the mixer stage 2 has a gate electrode connected through the capacitor C to the coils $S_1$ and $S_2$.

Figure 2:
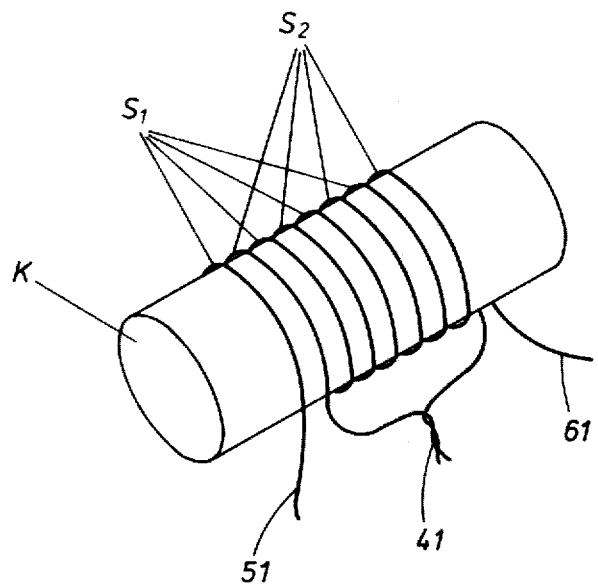
FIG. 2 is a diagrammatic perspective view of a bifilar coil assembly illustrating the preferred coupling coil arrangement for the circuit of FIG. 1.

In the configuration of coils shown in FIG. 2, the coils $S_1$, and $S_2$ are wound bifilarly on a ferrite core K. The coil $S_1$ has an end 51 at which the coil is connected to the output 5 of the input stage 1 of FIG. 1. The coil $S_2$ has an end 61 by which this coil is connected to output 6 of the local oscillator 3 of FIG. 1. The remaining ends of the bifilary wound coils $S_1$ and $S_2$ are fastened together at a common connection 41 at which both coils $S_1$ and $S_2$ are connected to the input 4 of the mixer stage 2 as shown in FIG. 1.

Because of their disposition with respect to each other and their external connections, the coils $S_1$ and $S_2$ provide signal paths for the respective signals of the input stage 1 and the local oscillator 3 that have opposite winding directions. For the purpose of better matching of the input 4 of the mixer stage to the output 5 of the input stage 1 and the output 6 of the local oscillator 3, it can be advantageous to connect a resistor (not shown) between the ends 51 and 61 of the respective coils $S_1$ and $S_2$.

It has been found useful in the application of the invention to tuners of television receivers to provide the coils of $S_1$ and $S_2$ with a ferrite core having a diameter of 2 mm and a length of 10 mm, and to wind bifilarly thereon two windings, each with six to seven turns of copper wire with a diameter of 0.2 mm, with preferably the same number of turns for each coil.

It is also within the scope of the present invention to replace the particular kind of coil arrangement illustrated in FIG. 2 by interdigital branched or forked elements of some kind, where the frequency ranges in question are such that the capacitive effects outweigh the electromagnetic ones. It is also to be understood that the winding configuration illustrated in FIG. 2 can be produced by printing or etching techniques providing strip conductors rather than by winding wires on the core.

Thus, it will be seen that although the invention has been described with reference to particular illustrative embodiments, variations and modifications are possible within the inventive concept.

I claim:

1. A high-frequency amplifier-mixer stage for radio or television receivers having an input stage, a local oscillator and a mixer stage to which the outputs of said input stage and said oscillator are applied as inputs, and comprising the improvement which consists in that:

first and second coils wound together bifilarly are used for coupling the outputs of said input stage and of said oscillator to the input of said mixer stage;

an input terminal (4) of said mixer stage (2) is connected through said first coil ($S_1$) to an output terminal (5) of said input stage (1);

said input terminal (4) of said mixer stage (2) is connected through said second coil ($S_2$) to an output terminal (6) of said oscillator (3);

the respective signal paths from said output terminals (5,6) of said input stage (1) and said oscillator (3) to said input terminal (4) of said mixer stage through said first and second coils ($S_1$, $S_2$) have opposed winding directions, and none of said terminals (4,5,6) is connected to ground or to a reference potential that is fixed with respect to ground potential.

2. A high-frequency amplifier-mixer stage as defined in claim 1 in which said first and second coils ($S_1$, $S_2$) have the same number of winding turns.

3. A high-frequency amplifier-mixer stage as defined in claim 1 or claim 2 in which said first and second coils ($S_1$, $S_2$) are wound on a ferrite core.

* * * * *